US 6,707,730 B2

(12) United States Patent
Mori et al.

(10) Patent No.: US 6,707,730 B2
(45) Date of Patent: Mar. 16, 2004

(54) SEMICONDUCTOR MEMORY DEVICE WITH EFFICIENT AND RELIABLE REDUNDANCY PROCESSING

(75) Inventors: Kaoru Mori, Kawasaki (JP); Masato Matsumiya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 32 days.

(21) Appl. No.: 10/066,603

(22) Filed: Feb. 6, 2002

(65) Prior Publication Data
US 2002/0141264 A1 Oct. 3, 2002

(30) Foreign Application Priority Data
Mar. 30, 2001 (JP) .......................... 2001-102175

(51) Int. Cl.[7] .................................. G11C 7/00
(52) U.S. Cl. .................. 365/200; 365/149; 365/154
(58) Field of Search ................. 365/200, 149, 365/154, 189.07, 189.05, 230.03, 230.06, 230.08, 225.7

(56) References Cited

U.S. PATENT DOCUMENTS 6,563,749 B2 * 5/2003 Ferrant .................. 365/200

* cited by examiner

Primary Examiner—Gene Auduong
(74) Attorney, Agent, or Firm—Arent Fox Kintner Plotkin & Kahn

(57) ABSTRACT

A semiconductor memory device includes a data buffer for inputting/outputting data from/to an exterior of the device, a plurality of DRAM cell array blocks, an SRAM redundancy cell which is situated around each of the plurality of DRAM cell array blocks, a fuse circuit which stores therein an address of a defect memory cell in the DRAM cell array blocks, a comparison circuit which compares an input address with the address stored in the fuse circuit, and an I/O bus which couple the SRAM redundancy cell to the data buffer in response to an address match found by the comparison circuit.

15 Claims, 9 Drawing Sheets

SEMICONDUCTOR MEMORY DEVICE WITH EFFICIENT AND RELIABLE REDUNDANCY PROCESSING

BACKGROUND OF THE INVENTION

1. Field of the Invention

The present invention generally relates to semiconductor memory devices, and particularly relates to a semiconductor memory device in which defect cells are replaced by redundancy cells.

2. Description of the Related Art

In semiconductor memory devices, a defect cell is replaced by a redundancy cell provided as a backup, and an access to the address of the defect cell is redirected as an access to the redundancy cell, thereby using the address of the defect cell as a valid address. For this purpose, generally, a whole row (i.e., word line) or a whole column (i.e., column line or data line) including a defect bit is replaced by a backup redundancy row or a backup redundancy column. Such replacement by the unit of one row or one column is an effective measure if a short-circuit or a severance of a damaged wire occurs with respect to a word line, a column line, a data line, etc. In the case of random defects that take place on a bit-by-bit basis, such replacement is not effective since the whole line may possibly be replaced for a single defective bit.

Against this background, Japanese Patent Laid-open Applications No. 1-303699 and No. 6-20494 each disclose a device in which a defective bit is specified as an intersection between a row and a column, and is matched against a redundancy bit on a bit-by-bit basis that is provided in a backup row or a backup column.

The degree of a random defect may not reach the level of a complete operational failure, and may be at such a level that the data retention time of a cell is shorter than a refresh interval that is set relatively long for the purpose of satisfying the demand for low power consumption. Such a cell is also treated as a defective bit. The data retention time of DRAM cells varies within a chip and exhibits a variation. When a cell of a short data retention time is replaced by a redundancy cell, therefore, the redundancy cell itself may be a defective cell having a short data retention time. In such a case, the redundancy technique of Japanese Patent Laid-open Applications No. 1-303699 and No. 6-20494 may not be as effective as to meet expectations.

Japanese Patent Laid-open Applications No. 64-59700 and No. 6-269299 each disclose a configuration in which an SRAM cell is used as a redundancy cell for bit-based redundancy processing. This makes it possible to avoid a replacement by a defect cell having a short data retention time.

The technology disclosed in Japanese Patent Laid-open Application No. 64-59700 uses a content addressable memory (CAM) or a circuitry comprised of a memory means and exclusive-OR gates as a means to detect a memory access to a defect address, and provides an address selection mechanism that is separate from that of a DRAM memory array. This makes it possible to redirect an access as an access to a redundancy bit while maintaining the access to the DRAM memory array as a valid access, thereby making it easier to control the timing of the DRAM. However, since the content addressable memory is comprised of logic gates and memory cells, an attempt to increase replaceable bits results in an increasingly complex circuit configuration and an increased circuit size.

In the configurations disclosed by Japanese Patent Laid-open Applications No. 64-59700 and No. 6-269299, a main memory and a backup memory are provided as separate units, and a selecting mechanism for accessing the main memory and an associated driver circuit are separately provided from a selecting mechanism for accessing the backup memory and an associated driver circuit. These circuitries are driven simultaneously, and a selection is made between the data of one of the circuitries and the data of the other. In this configuration, the main memory and the backup memory are provided with the respective circuitries as separate units, resulting in undesirable increases of chip size and power consumption.

Accordingly, there is a need for a semiconductor memory device that can cope with a single bit defect efficiently without an increase in chip size and power consumption.

SUMMARY OF THE INVENTION

It is a general object of the present invention to provide a semiconductor memory device that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a semiconductor memory device particularly pointed out in the specification in such full, clear, concise, and exact terms as to enable a person having ordinary skill in the art to practice the invention.

To achieve these and other advantages and in accordance with the purpose of the invention, as embodied and broadly described herein, a semiconductor memory device according to the present invention includes a data buffer for inputting/outputting data from/to an exterior of the device, a plurality of DRAM cell array blocks, an SRAM redundancy cell which is situated around each of the plurality of DRAM cell array blocks, a fuse circuit which stores therein an address of a defect memory cell in the DRAM cell array blocks, a comparison circuit which compares an input address with the address stored in the fuse circuit, and an I/O bus which couple the SRAM redundancy cell to the data buffer in response to an address match found by the comparison circuit.

In the invention described above, all bits of address signals (i.e., a row address, a block address, and a column address) are compared with the address of a defect memory cell to determine whether redundancy processing is necessary. In the case of redundancy processing being necessary, a data write/read operation is performed with respect to the SRAM redundancy cell. According to one aspect of the present invention, all the bits of the input address are compared with the address of a defect memory cell, thereby determining whether to select a routine column line or to select a redundancy column line. In the case of redundancy processing being performed, the selective activation of a redundancy column line and a block line achieves a data write/read operation with respect to the SRAM redundancy cell. This makes it possible to replace a memory cell with a redundancy memory cell on a bit-by-bit basis, and attains reliable redundancy processing based on the use of SRAM cells. Further, there is no need to provide an address selection circuit and a data access circuit dedicated for SRAM cells in addition to circuitry for DRAM memory cells, so that an efficient use of the chip area is achieved, and an increase in power consumption is prevented.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 1:
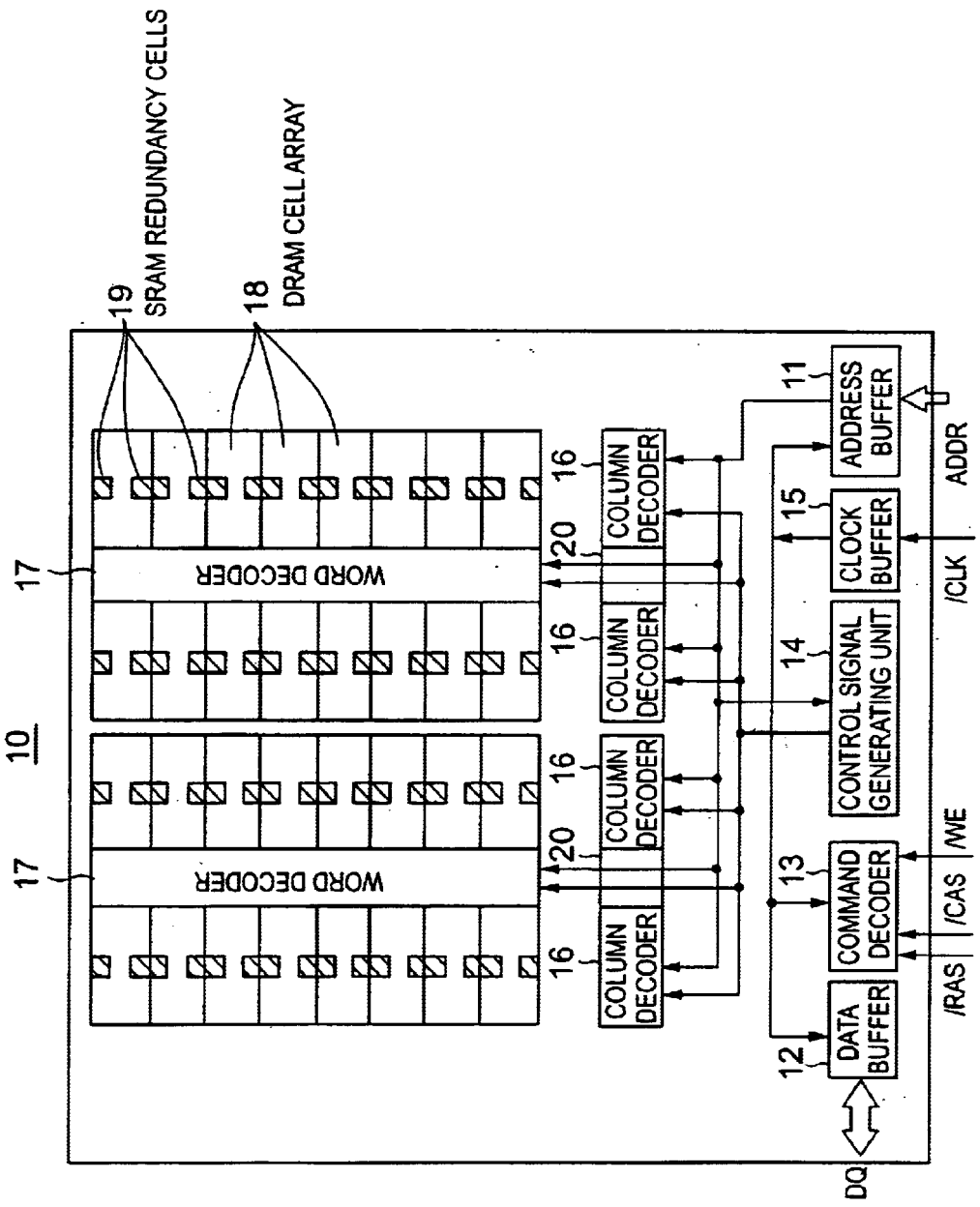
FIG. 1 is a block diagram showing a configuration of a semiconductor memory device according to the present invention.

FIG. 1 is a block diagram showing a configuration of a semiconductor memory device according to the present invention.

A semiconductor memory device 10 of FIG. 1 includes an address buffer 11, a data buffer 12, a command decoder 13, a control signal generating unit 14, a clock buffer 15, a plurality of column decoders 16, a plurality of word decoders 17, a plurality of DRAM cell arrays 18, a plurality of SRAM redundancy cells 19, and a plurality of fuse boxes 20.

The DRAM cell arrays 18 each have memory cells arranged in rows and columns that are implemented based on capacitors serving as memory elements. In each of the DRAM cell arrays 18, circuitry and wires such as sense amplifiers, word lines, column lines, cell transistors, etc., are provided for the purpose of specifying addresses for reading/writing data from/into the memory cells. Each of the DRAM cell arrays 18 is provided as a single block, and a series of sense amplifiers (not shown) arranged in line is situated between the DRAM cell arrays 18. In the example of FIG. 1, part of the areas where the series of sense amplifiers are located is used for providing the SRAM redundancy cells 19.

The address buffer 11 receives address signals ADDR from an exterior of the device, and supplies them to the control signal generating unit 14, the column decoders 16, and the word decoders 17 at appropriate timing.

The data buffer 12 supplies data to the DRAM cell arrays 18 at appropriate timing through data paths (not shown) as the data is provided from the exterior of the device, and supplies data to the exterior of the device as the data is read from the DRAM cell arrays 18.

The command decoder 13 receives control signals /RAS, /CAS, /WE, etc., from the exterior of the device, and decodes commands represented by the control signals, followed by supplying the decoded results to the control signal generating unit 14. Based on the decoded results, the control signal generating unit 14 controls operations and operation timings of various units such as the column decoders 16 and the word decoders 17. Namely, the control signal generating unit 14 supplies control timing signals to the various units of the semiconductor memory device 10, and these units operate at appropriate timings, thereby effecting data write/read operations of the semiconductor memory device 10.

The clock buffer 15 receives a clock signal CLK from the exterior of the device, and supplies the clock signal CLK to the address buffer 11, the data buffer 12, the command decoder 13, etc. With this provision, the data acquisition timing and operation timing of each unit are properly controlled.

The word decoders 17 decode a row address supplied from the address buffer 11, and activate a word line corresponding to the row address. Cell transistors connected to the activated word line become conductive, resulting in the data of memory cells of the selected word address being read.

The column decoders 16 decode a column address supplied from the address buffer 11, and activate a column line corresponding to the column address. In response, a corresponding column transistor becomes conductive, thereby effecting data transfer between a corresponding sense amplifier and the data buffer 12.

In the case of read operations, data are read to bit lines from memory cells connected to the activated word line, and the data on the bit lines are amplified by the sense amplifiers. The amplified data are read from sense amplifiers corresponding to an activated column line, and are supplied to the data buffer 12. In the case of write operations, the order of things is reverse to the case of read operations. Sense amplifiers selected by an activated column line receive data supplied from the data buffer 12. Then, the data are supplied from the sense amplifiers to memory cells via bit lines, and are stored in the memory cells connected to an activated word line.

The SRAM redundancy cells 19 are situated in a space that is provided as part of the area where the line of sense amplifiers is implemented. The SRAM redundancy cells 19 are provided as many as predetermined with respect to each cell mat, and each serve as a redundancy cell that is allocated to a defective memory cell in the corresponding cell mat on a one-to-one basis. The fuse boxes 20 control a redirecting operation by which a memory access to a defective cell is redirected to one of the SRAM redundancy cells 19 according to the severed/intact conditions of internal fuses.

Figure 2:
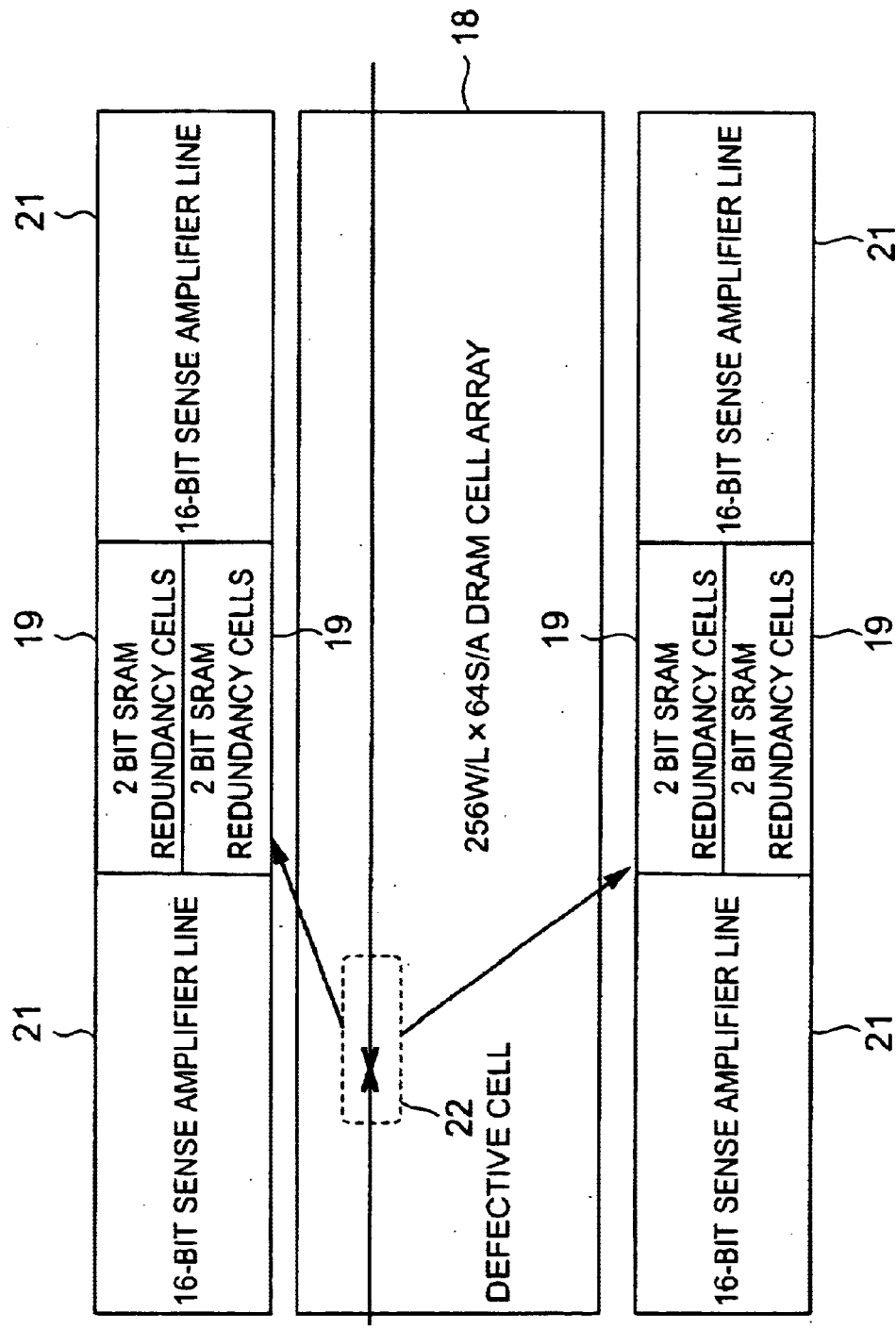
FIG. 2 is an illustrative drawing showing the arrangement of a DRAM cell array and SRAM redundancy cells.

FIG. 2 is an illustrative drawing showing the arrangement of a DRAM cell array and SRAM redundancy cells.

FIG. 2 shows a cell mat corresponding to one of the DRAM cell arrays 18. In this example, a DRAM cell array 18 is a 256-x-64-bit configuration in which 256 words corresponding to 256 word lines are each provided for 64 bits that correspond to 64 sense amplifiers. Above and below the DRAM cell array 18, sense-amplifier lines 21 comprised of sense amplifiers are situated. In this example, each of the sense-amplifier lines 21 includes 16 sense amplifiers, and amplifies signals of 16-bit data.

The DRAM cell arrays 18 are arranged adjacent to each other in rows and columns as shown in FIG. 1, and FIG. 2 shows a cell mat of one of the DRAM cell arrays 18. The sense-amplifier lines 21 are thus positioned between the adjacent DRAM cell arrays 18.

As shown in FIG. 2, part of a chip area where the sense-amplifier lines 21 are situated between the adjacent DRAM cell arrays 18 is used as an area for accommodating the SRAM redundancy cells 19. The SRAM redundancy cells 19 provided in this chip area serve as backup cells for a defective cell 22 if the defective cell exists in the DRAM cell array 18. In the example of FIG. 2, each of the SRAM redundancy cells 19 includes a 2-bit SRAM cell. Among the four SRAM redundancy cells 19 shown in FIG. 2, two of them located on the side facing the DRAM cell array 18 of FIG. 2 are used for redundancy processing of the DRAM cell array 18 shown in FIG. 2. The two SRAM redundancy cells 19 located on the side opposite to the DRAM cell array 18 of FIG. 2 are used for redundancy processing of the DRAM cell arrays 18 adjacent to the DRAM cell array 18 of FIG. 2.

If a memory configuration is such that data is read by the unit of four bits, memory cells of 4 bits including the defective cell 22 are replaced by the two SRAM redundancy cells 19, each of which corresponds to 2 bits. In this manner, redundancy processing for one defect location can be made with respect to one DRAM-cell array 18 in the example of FIG. 2.

Figure 3:
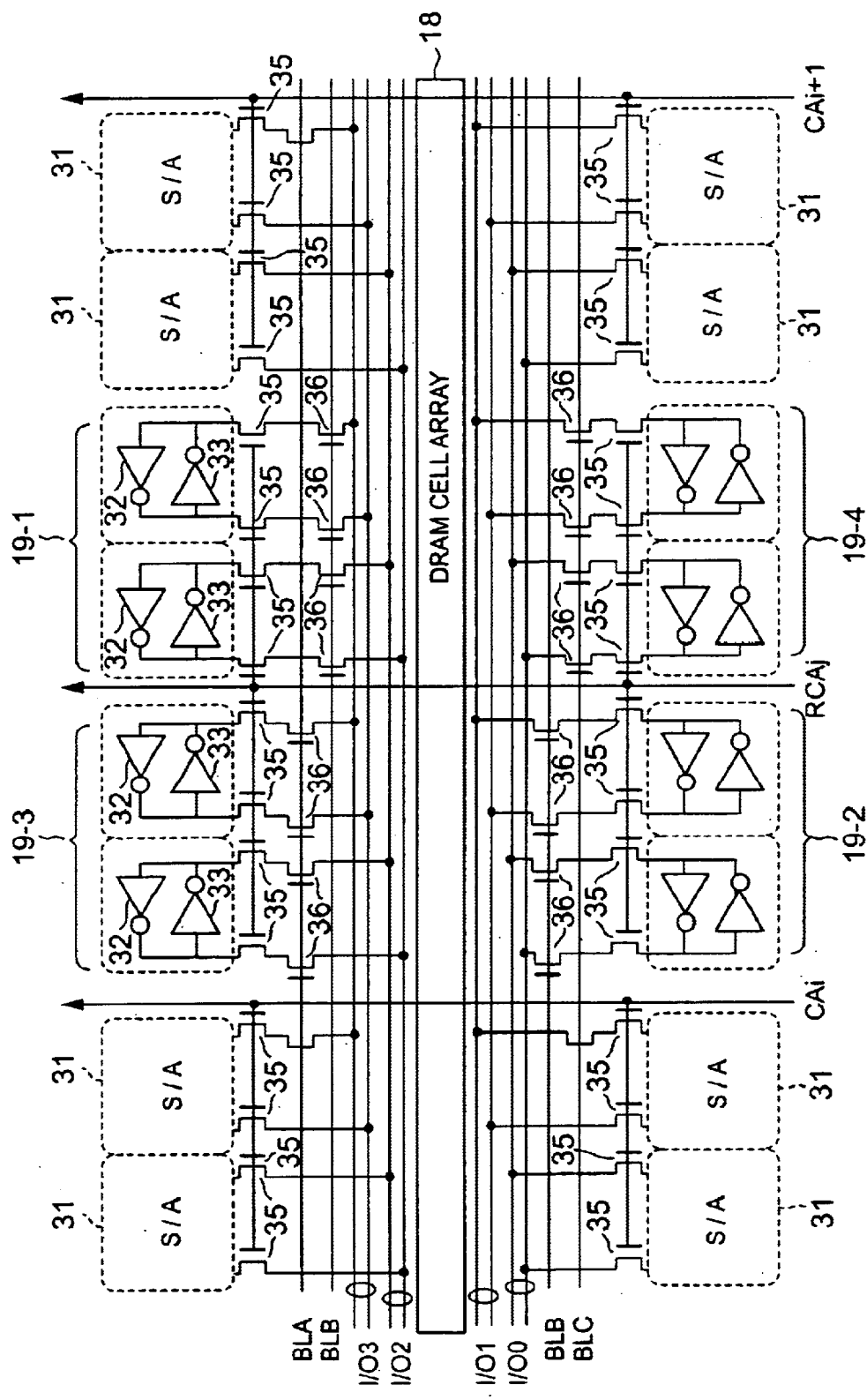
FIG. 3 is a circuit diagram showing a circuit configuration around the SRAM redundancy cells.

FIG. 3 is a circuit diagram showing a circuit configuration around the SRAM redundancy cells 19.

In FIG. 3, the SRAM redundancy cells 19 are shown as SRAM redundancy cells 19-1 through 19-4 for the sake of explanation. The SRAM redundancy cells 19-1 and 19-2 are used for redundancy processing of the DRAM cell array 18 shown in FIG. 3. The SRAM redundancy cell 19-3 is used for redundancy processing of a DRAM cell array that is adjacent to and located above the DRAM cell array 18 of FIG. 3. The SRAM redundancy cell 19-4 is used for redundancy processing of a DRAM cell array that is adjacent to and located below the DRAM cell array 18 of FIG. 3.

Each of the SRAM redundancy cells 19-1 through 19-4 includes two latches each comprised of two inverters 32 and 33, and stores two-bit data therein.

Data stored in memory cells of the DRAM cell array 18 are subjected to word selection by one of the word lines that is selectively activated at the time of data reading. The data corresponding to the selected word line is supplied to sense amplifiers 31 via bit lines, and are thereby amplified. The sense amplifiers 31 are provided as many as 16 to form a group, which constitutes one of the sense-amplifier lines 21 shown in FIG. 2.

Figure 4:
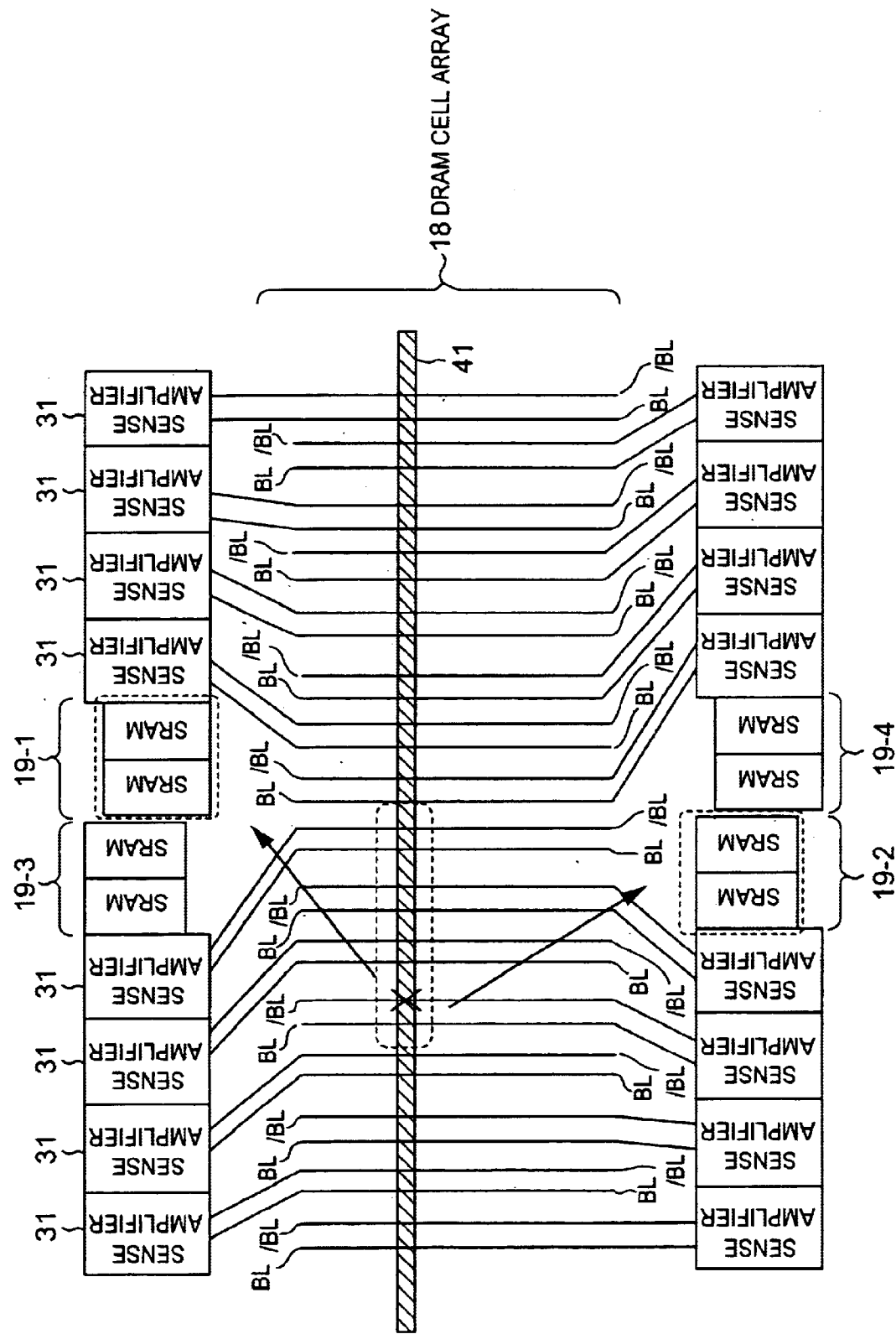
FIG. 4 is a drawing showing the relationships between a DRAM cell array, sense amplifiers, and SRAM redundancy cells.

FIG. 4 is a drawing showing the relationships between a DRAM cell array, sense amplifiers, and SRAM redundancy cells.

In FIG. 4, only one word line 41 is shown for the sake of convenience of explanation. When the word line 41 is selected at the time of data reading, data is read from memory cells corresponding to the word line 41. The retrieved data are supplied to the respective sense amplifiers 31 via bit lines BL and /BL. The sense amplifiers 31 amplify the data on the bit lines BL and /BL in such a manner as to expand the potential gap between the bit lines BL and /BL. As shown in FIG. 4, each pair of the bit lines BL and /BL is connected alternately to a corresponding one of the sense amplifiers 31 on the upper side of the figure and to a corresponding one of the sense amplifiers 31 on the lower side of the figure.

If there is a defective memory cell among the memory cells connected to the word line 41, 4 bits of data, for example, are subjected to redundancy processing by the SRAM redundancy cells 19-1 and 19-2 as shown by dotted enclosing lines and thick arrows in FIG. 4.

A data read operation will be described with reference to FIG. 3 again.

When data of memory cells of the DRAM cell array 18 are stored in the sense amplifiers 31 as described above, the column decoders 16 shown in FIG. 1 activates a column line corresponding to a selected column address. If a column line CAi shown in FIG. 3 is activated, for example, NMOS transistors 35 having the gates thereof connected to the column line CAi become conductive, thereby supplying data of the corresponding sense amplifiers 31 to I/O buses I/O0 through I/O3. The data on the I/O buses I/O0 through I/O3 are supplied to the data buffer 12 of FIG. 1 via amplifiers and the like, followed by being output to the exterior of the semiconductor memory device 10. In this manner, data of 4 bits are read for one column address in the example of FIG. 3.

If there is a defective cell on the selected word, 4-bit data inclusive of this defective cell are replaced by the SRAM redundancy cells 19-1 and 19-2. In detail, information about the address of the defective cell is held in the fuse boxes 20 shown in FIG. 1. Selection of the address of the defective cell (i.e., row address and column address) will result in the selective activation of a corresponding redundancy column line RCAj rather than the selective activation of a column line corresponding to the column address. As a result, NMOS transistors 35 having the gates thereof connected to the redundancy column line RCAj become conductive. Further, a block signal indicative of a corresponding DRAM cell array block 18 is selectively activated based on the specified row address. In the configuration of FIG. 3, a block signal BLB is selected that corresponds to the DRAM cell array 18 shown in FIG. 3. NMOS transistors 36 having the block signal BLB supplied to the gates thereof become conductive, so that the data of the SRAM redundancy cells 19-1 and 19-2 is supplied to the I/O buses I/O0 through I/O3. The data of the I/O buses I/O0 through I/O3 are then supplied to the data buffer 12 via amplifiers and the like, and are output to the exterior of the semiconductor memory device 10.

A block signal BLA is activated when selecting a DRAM cell array that is adjacent to and located above the DRAM cell array 18 of FIG. 3. If this DRAM cell array adjacent to and located above the DRAM cell array 18 of FIG. 3 is subjected to redundancy processing, the activation of the block signal BLA results in the data of the SRAM redundancy cell 19-3 being supplied to the I/O buses I/O0 through I/O3. By the same token, a block signal BLC is activated when selecting a DRAM cell array that is adjacent to and located below the DRAM cell array 18 of FIG. 3.

In this manner, when an address of a non-defective cell is specified, data are read from the sense amplifiers 31. If an address of a defective cell is specified, data are read from the SRAM redundancy cells through redundancy processing. In the case of data writing, data travel in the opposite direction to the case of data reading, and are stored in DRAM memory cells at the specified address or in the corresponding SRAM redundancy memory cells.

Figure 5:
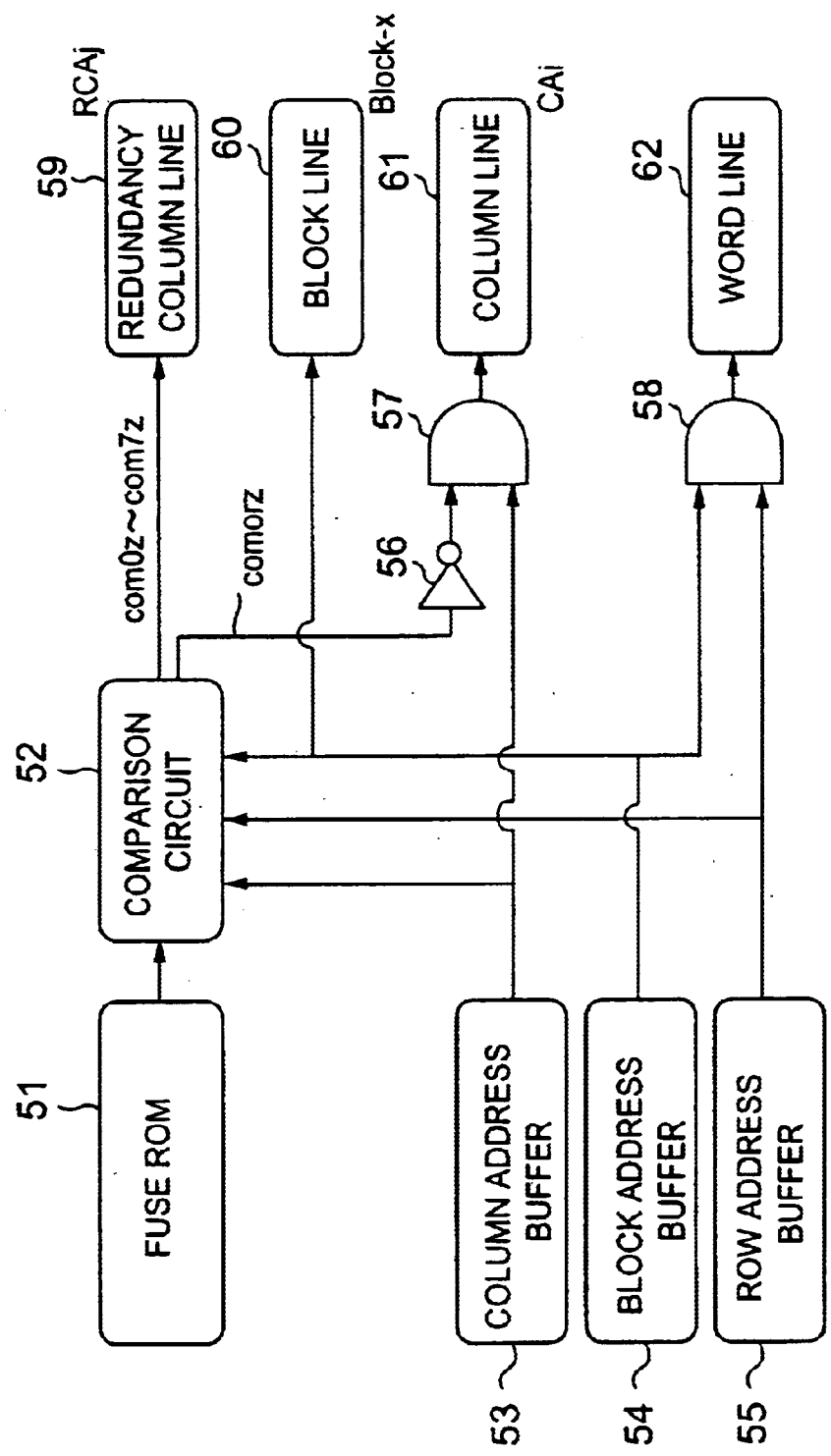
FIG. 5 is a block diagram illustratively showing the control of redundancy processing according to the present invention.

FIG. 5 is a block diagram illustratively showing the control of redundancy processing according to the present invention.

The redundancy processing control mechanism of FIG. 5 includes a fuse ROM 51, a comparison circuit 52, a column address buffer 53, a block address buffer 54, a row address buffer 55, an inverter 56, and AND circuits 57 and 58. These circuitry elements are used to control a redundancy column line 59, a block line 60, a column line 61, and a word line 62. The fuse ROM 51 and the comparison circuit 52 are included in the fuse boxes 20 of FIG. 1. The column address buffer 53, the block address buffer 54, and the row address buffer 55 may be provided inside the address buffer 11, for example.

The fuse ROM 51 holds information indicative of defective addresses that are represented by the severed/intact conditions of internal fuses, and supplies the information to the comparison circuit 52. The comparison circuit 52 compares the information indicative of defective addresses supplied from the fuse ROM 51 with an address to be accessed that is supplied from the column address buffer 53, the block address buffer 54, and the row address buffer 55.

If the accessed address differs from any one of the defective addresses, the comparison circuit 52 brings a redundancy check signal comorz down to LOW. In response, the output of the inverter 56 becomes HIGH, thereby selectively activating the column line 61 corresponding to the column address stored in the column address buffer 53. At the same time, the word line 62 is selectively activated based on the row address of the row address buffer 55 and the block address of the block address buffer 54. The selective activation of the word line 62 and the column line 61 results in a data read operation or a data write operation being performed with respect to the specified address.

If the accessed address is the same as one of the defective addresses, the comparison circuit 52 turns the redundancy check signal comorz to HIGH. In response, the output of the inverter 56 becomes LOW, so that the column line 61 directed to non-defective memory cells is not activated. Further, the comparison circuit 52 activates one of the redundancy column line selecting signals com0z through com7z that corresponds to the accessed address. As a result, a corresponding one of the redundancy column lines 59 (RCAj: j=0 through 7) is selectively activated. At the same time, the block line 60 is selectively activated that corresponds to the block address stored in the block address buffer 54. The activation of the selected redundancy column line 59 and the selected block line 60 (corresponding to one of the block signals BLA through BLC in FIG. 3) results in a data read operation or a data write operation being performed with respect to the redundancy cells in the case of the specified address being a defective address.

The word line 62 is selectively activated regardless of whether the input address is an address of a defective cell, i.e., whether the redundancy processing is carried out. As a result, the data of a defective cell is read to the sense amplifier in the case of read operation. When the redundancy processing is performed, however, the data of the defective cell stored in the sense amplifier is disregarded, and the data of the SRAM redundancy cells are supplied to the data buffer through the I/O buses.

Figure 6:
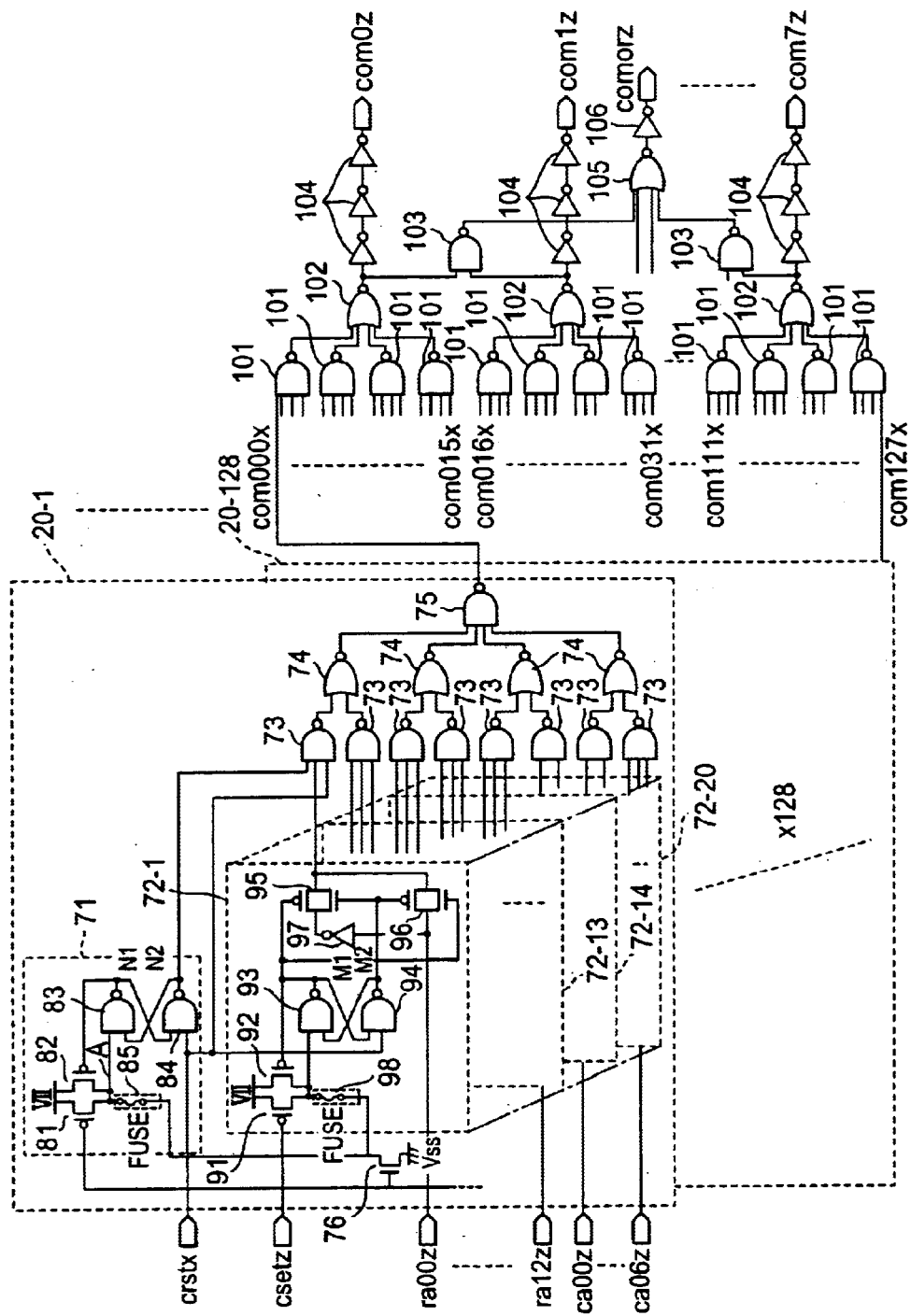
FIG. 6 is a circuit diagram showing circuitry around fuse boxes.

FIG. 6 is a circuit diagram showing circuitry around the fuse boxes.

A configuration of FIG. 6 can cope with a total of 128 defect cells by providing 128 fuse boxes. The 128 fuse boxes are shown here as fuse boxes 20-1 through 20-128 for the sake of explanation. These fuse boxes have an identical configuration.

The fuse box 20-1 includes a redundancy check circuit 71, 20 fuse circuits 72-1 through 72-20, a plurality of NAND circuits 73, a plurality of NOR circuits 74, a NAND circuit 75, and an NMOS transistor 76. The redundancy check circuit 71 determines based on the severed/intact conditions of internal fuses whether redundancy processing is performed. The fuse circuits 72-1 through 72-20 store therein 20 bits of address information based on the severed/intact conditions of internal fuses. The address information represents addresses of defective cells. The NAND circuits 73, the NOR circuits 74, and the NAND circuit 75 correspond to the comparison circuit 52 shown in FIG. 5, and compares the addresses of defective cells with an input address that is represented by address signals ra00z through ra12z and ca00z through ca06z.

The redundancy check circuit 71 includes PMOS transistors 81 and 82, NAND circuits 83 and 84, and a fuse 85. The NAND circuits 83 and 84 receive each other's output as an input thereof, and together form a latch. A signal crstx is LOW at the time of power-on of the device, and thereafter becomes HIGH. A signal csetz is a pulse signal that is LOW at the power-on of the device, and becomes HIGH at the timing at which the severed/intact conditions of fuses are detected. At the time of power-on of the device, the signal crstx and a signal csetz are LOW. In response, the latch comprised of the NAND circuits 83 and 84 is reset such that nodes N1 and N2 are LOW and HIGH, respectively. Thereafter, the signal crstx becomes HIGH, but the state of the latch stays unchanged.

If the fuse 85 is intact, the potential of a node A drops to LOW when the NMOS transistor 76 becomes conductive in response to the change to HIGH of the signal csetz for the purpose of detecting the severed/intact conditions of fuses. As a result, the latch comprised of NAND circuit 83 and 84 is reset such that the nodes N1 and N2 are HIGH and LOW, respectively. The signal csetz thereafter becomes LOW, so that the node A moves to HIGH again. Despite this, the respective HIGH and LOW potentials of the nodes N1 and N2 stay unchanged. Since no address comparison is made in this case, no redundancy processing is carried out.

If the fuse 85 is severed, the HIGH potential of the node A does not change even when the signal csetz becomes HIGH. Accordingly, the latch state in which the nodes N1 and N2 are LOW and HIGH, respectively, stays unchanged. In this case, address comparison is made, and redundancy processing is performed.

In this manner, the redundancy check circuit 71 determines whether to perform redundancy processing depending on whether the fuse 85 is intact or severed.

The fuse circuit 72-1 includes PMOS transistors 91 and 92, NAND circuits 93 and 94, transfer gates 95 and 96 comprised of a PMOS transistor and a NMOS transistor, an inverter 97, and a fuse 98. The NAND circuits 93 and 94 receive each other's output as an input thereof, thereby forming a latch. The latching operation of the fuse circuit 72-1 is the same as that of the redundancy check circuit 71.

If the fuse 98 is intact, the latch is set in such a state that nodes M1 and M2 are HIGH and LOW, respectively. In this case, the address signal ra00z is supplied to the NAND circuit 73 via the transfer gate 96. If the fuse 98 is severed, the latch is set in such a state that the nodes M1 and M2 are LOW and HIGH, respectively. In this case, an inverse of the address signal ra00z is supplied to the NAND circuit 73 via the transfer gate 95.

The same operation as described above is performed in all of the fuse circuits 72-1 through 72-20. As a result, outputs of the fuse circuits 72-1 through 72-20 all become HIGH only if the fuses 98 are severed in the fuse circuits corresponding to "0" bits among the 20 bits of the address signals ra00z through ra12z and ca00z through ca06z and if the fuses 98 are intact in other places.

In such a case, outputs of all the NAND circuits 73 are LOW, and outputs of all the NOR circuits 74 are HIGH. As a result, the output of the NAND circuit 75 is LOW.

In this manner, if the severed/intact conditions of the fuses 98 in the fuse circuits 72-1 through 72-20 match an input address, the fuse box 20-1 outputs a LOW signal. It should be noted here that among the address signals ra00z through ra12z, 5 bits, for example, represent a block address.

One NOR circuit 102 receives outputs of four NAND circuits 101. The four NAND circuits 101 receives outputs of 16 fuse boxes. Thus, this NOR circuit 102 outputs a LOW signal if any one of the 16 fuse boxes detects an address match so as to output a LOW signal. If none of the fuse boxes detects an address match, the output of the NOR circuit 102 is HIGH.

A LOW signal that is output from one of the NOR circuits 102 in response to an address match passes through three inverters 104, and is then output as one of the redundancy column line selecting signals com0z through com7z. As a result, one of the redundancy column lines RCAj (j=0 through 7) is selectively activated.

Further, the outputs of the NOR circuits 102 are put together by a NAND circuit 103, a NOR circuit 105, and an inverter 106. As a consequence, the redundancy check signal comorz that is an output of the inverter 106 becomes HIGH if the input address matches a redundancy address. As described in connection with FIG. 5, a column line directed to non-defective memory cells is thus not activated.

In the configuration described above, the plurality of NAND circuits 101, the plurality of NOR circuits 102, the plurality of NAND circuits 103, the plurality of inverters 104, the NOR circuit 105, and the inverter 106 may be provided inside the column decoders 16 shown in FIG. 1, for example.

It may be worth pointing out that one of the redundancy column line selecting signals com0z through com7z corresponds to the DRAM cell array 18 having the 256-x-64 configuration shown in FIG. 2. In detail, a single redundancy column line RCAj is provided for each 256-x-64 DRAM cell array 18, and is used to select a line of DRAM cell arrays 18 arranged in a column direction in which a column line extends (i.e., the vertical direction in FIG. 2). Further, one of the DRAM cell arrays 18 arranged in the column direction is selected by the block signal as described in connection with FIG. 3.

In this manner, the present invention compares all the bits of address signals including a row address, a block address, and a column address with redundancy addresses, thereby determining whether to select a routine column line or to select a redundancy column line. If redundancy processing is performed, a data write/read operation is carried out with respect to the SRAM redundancy cells that correspond to a selectively activated redundancy column line and a selectively activated block line. This makes it possible to achieve one-to-one replacement of a memory cell with a redundancy cell and to perform reliable redundancy processing based on the use of SRAM cells. Since there is no need to provide an address selecting circuit and a data accessing circuit dedicated for SRAM cells in addition to circuits for the DRAM memory, an efficient use of chip areas is achieved, and an increase of power consumption is prevented.

Figure 7:
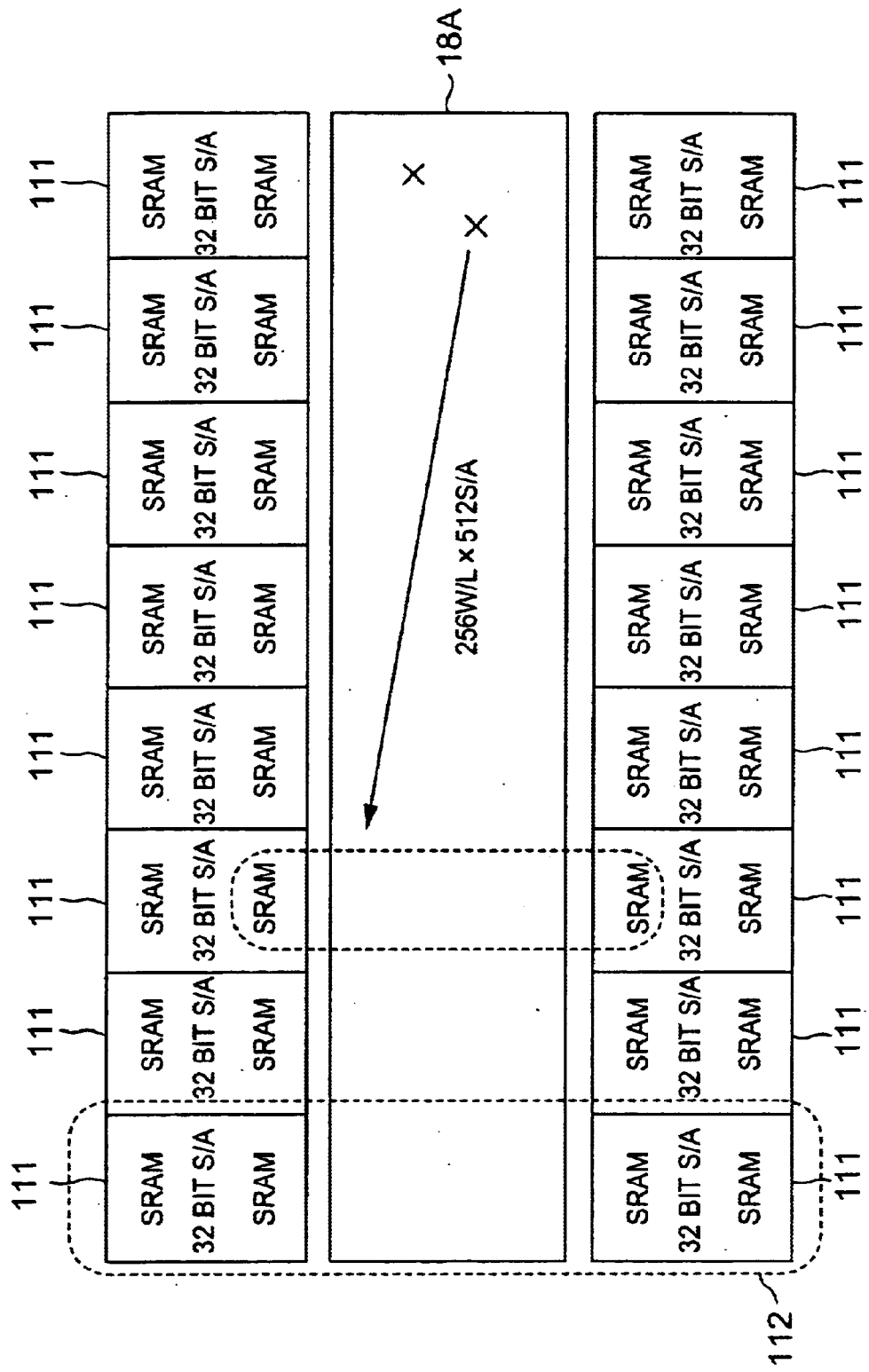
FIG. 7 is an illustrative drawing showing the arrangement of a DRAM cell array and SRAM redundancy cells.

FIG. 7 is an illustrative drawing showing the arrangement of a DRAM cell array and SRAM redundancy cells.

In the configuration shown in FIG. 2, the two-bit SRAM redundancy cells 19 are provided as many as two for the 256-x-64 DRAM cell array 18. In the configuration of FIG. 7, on the other hand, the configuration of FIG. 2 is repeated eight-fold in the direction in which a word line extends, thereby making up a 256-x-512 DRAM cell array 18. A sense-amplifier-line-&-SRAM-redundancy-cell unit 111 includes 32-bit sense amplifiers and two two-bit SRAM redundancy cells, and is provided as many as 8 in each of the upper line and the lower line, i.e., as many as 16 in total.

A portion 112 enclosed in dotted lines in FIG. 7 corresponds to the entire configuration of FIG. 2. Namely, a portion of the DRAM cell array 18A included in the dot-line-enclosed portion 112 corresponds to a 256-x-64 DRAM cell array 18. Each sense-amplifier-line-&-SRAM-redundancy-cell unit 111 corresponds to the two sense amplifier lines 21 and the two SRAM redundancy cells 19 (FIG. 2).

Such a configuration as described above increases the latitude in salvaging defect cells. In the configuration of FIG. 2, the number of redundancy cells is only sufficient to salvage a single group of four bits with respect to the 256-x64 DRAM cell array 18. Accordingly, if the 256-x-64 DRAM cell array 18 suffers defective cells at two separate locations, one of these defects cannot be salvaged. In the configuration of FIG. 7, consideration is now given to a situation where defective cells are found at two locations indicated as "X" in the 256-x-512 DRAM cell array 18A. In this case, the SRAM redundancy cells of the sense-amplifier-line-&-SRAM-redundancy-cell unit 111 corresponding to the 256-x-64 cell group that suffer the two defective cells may be allocated to one of the defective cells, yet the other defective cell can be salvaged by SRAM redundancy cells corresponding to another 256-x-64 cell group indicated by an arrow.

In order to realize such redundancy processing when two defect cells are detected within the 256-x-64 DRAM cell array 18 as shown in FIG. 2, the address of a second defect cell may be assigned to the a redundancy column line selecting signal comiz that is different from the redundancy column line selecting signal comjz corresponding to this 256-x-64 DRAM cell array 18. Such assignment may be made by making appropriate address settings to the fuse boxes 20. For example, if 16 adjacent fuse boxes among the 128 fuse boxes 20-1 through 20-128 shown in FIG. 6 correspond to the same redundancy column line selecting signal, the address of a second defect cell may be assigned to a fuse box that is spatially apart by more than 16 boxes from the fuse box assigned for the first defect cell. In this manner, any 8 defect cells within the DRAM cell array 18A shown in FIG. 7 can be salvaged by redundancy processing.

Figure 8:
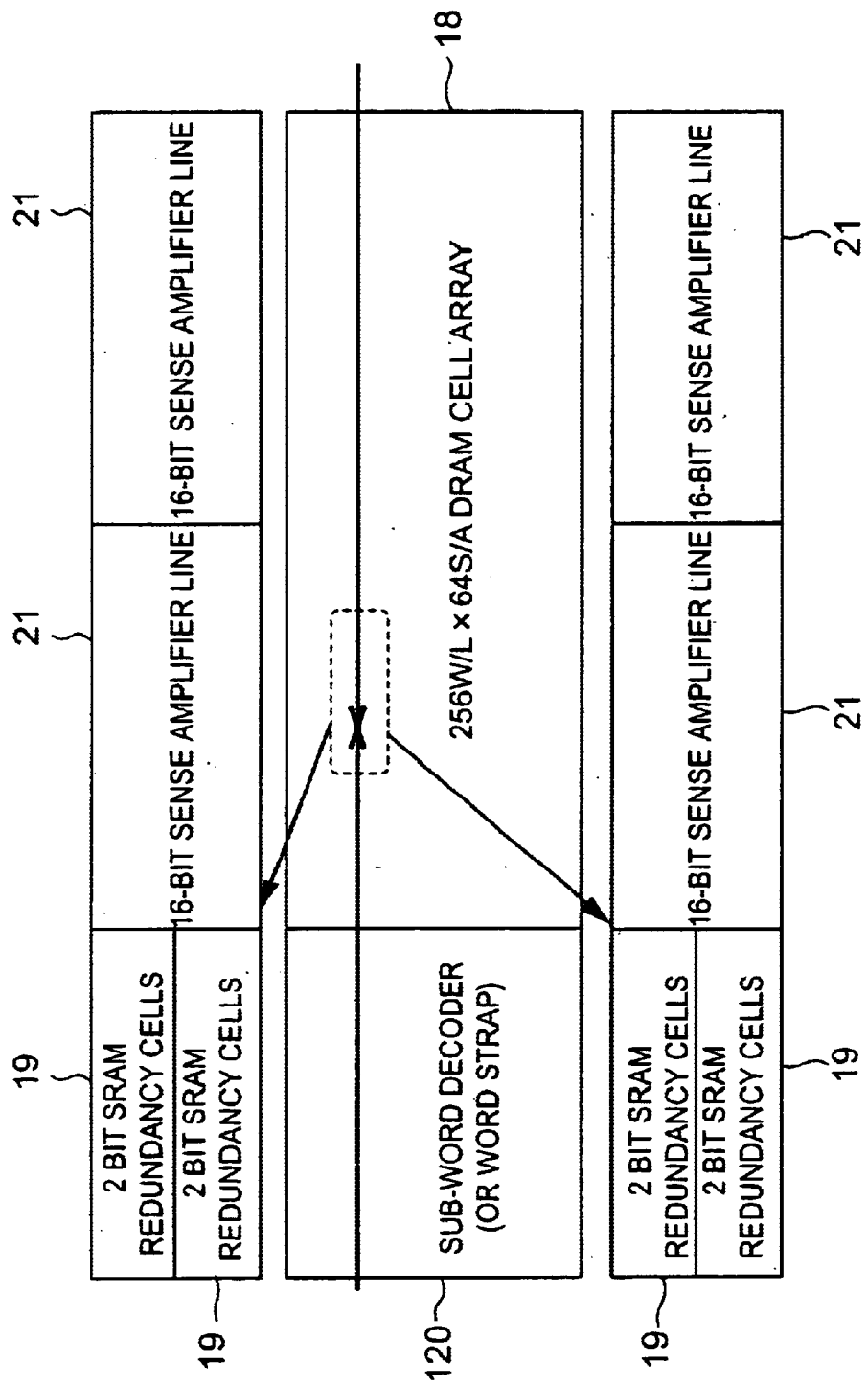
FIG. 8 is a drawing showing a variation of the arrangement of a DRAM cell array and SRAM redundancy cells.

FIG. 8 is a drawing showing a variation of the arrangement of a DRAM cell array and SRAM redundancy cells.

Like the configuration of FIG. 2, the DRAM cell array 18 shown in FIG. 8 has a 256-x-64-bit configuration in which 256 words corresponding to 256 word lines are each provided for 64 bits that correspond to 64 sense amplifiers. Above and below the DRAM cell array 18, the sense-amplifier lines 21 comprised of sense amplifiers are situated. In this example, each of the sense-amplifier lines 21 includes 16 sense amplifiers, and amplifies signals of 16-bit data. On the left-hand side of the DRAM cell array 18, a sub-word decoder 120 is provided to abut on the DRAM cell array 18.

As shown in FIG. 8, the SRAM redundancy cells 19 are situated at cross sections of the sense-amplifier lines 21 and the sub-word decoder 120. Namely, the SRAM redundancy cells 19 are positioned in areas where an imaginary extension of the sense-amplifier lines 21 and an imaginary extension of the sub-word decoder 120 intersect. In the example of FIG. 8, each SRAM redundancy cell 19 includes two bit SRAM cells. If a memory configuration is such that data is read by the unit of four bits, memory cells of 4 bits including a defective cell are replaced by the two SRAM redundancy cells 19, each of which corresponds to 2 bits. In this manner, redundancy processing for one defect location can be made with respect to one DRAM-cell array 18 in the example of FIG. 8.

In the configuration of FIG. 8 in which the SRAM redundancy cells 19 are situated at the cross sections of the sense-amplifier lines 21 and the sub-word decoder 120, an efficient use of the chip area can be made in the same manner as in the configuration of FIG. 2. As a further variation of FIG. 8, a portion of the area occupied by the subword decoder 120 may be used as an area for providing the SRAM redundancy cells 19. Alternatively, a portion of the area occupied by each of the word decoders 17 shown in FIG. 1 may be used for providing the SRAM redundancy cells 19.

Figure 9:
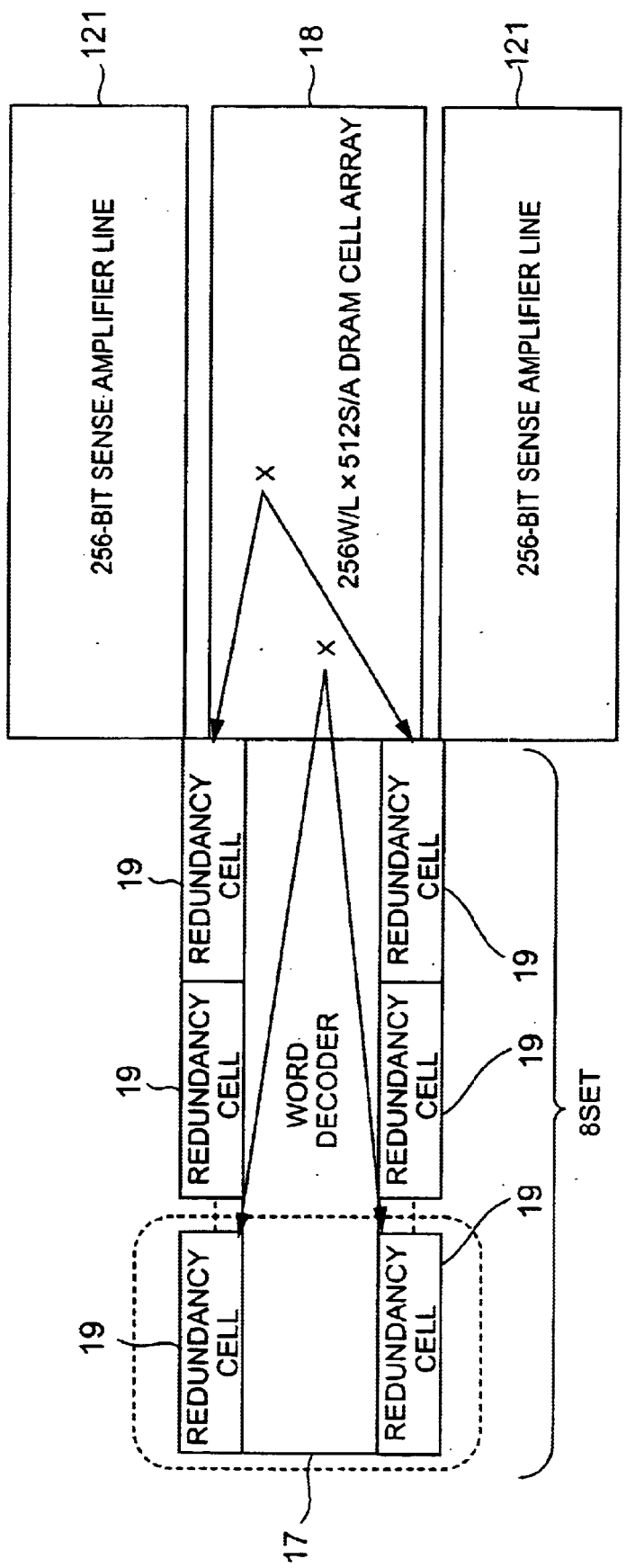
FIG. 9 is an illustrative drawing showing a configuration in which the SRAM redundancy cells are positioned in part of a word-decoder area.

FIG. 9 is an illustrative drawing showing a configuration in which the SRAM redundancy cells are positioned in part of the word-decoder area.

The DRAM cell array 18 has a 256-x-512-bit configuration in which 256 words corresponding to 256 word lines are each provided for 512 bits that correspond to 512 sense amplifiers. Above and below the DRAM cell array 18, sense-amplifier lines 121 comprised of sense amplifiers are situated. In this example, each of the sense-amplifier lines 121 includes 256 sense amplifiers, and amplifies signals of 256-bit data. On the left-hand side of the DRAM cell array 18, the word decoder 17 is provided to abut on the DRAM cell array 18.

In the configuration of FIG. 9, the SRAM redundancy cells 19 are situated in spaces that are created by setting aside part of the area where the word decoder 17 is located for the purpose of making a word selection for the DRAM cell arrays 18. Each SRAM redundancy cell 19 includes two bit SRAM cells. If a memory configuration is such that data is read by the unit of four bits, memory cells of 4 bits including a defective cell are replaced by the two SRAM redundancy cells 19, each of which corresponds to 2 bits. In the example of FIG. 9, 8 pairs of the SRAM redundancy cells 19 are provided, so that redundancy processing for 8 defect locations can be made with respect to the 256-x-512 DRAM cell array 18 shown in FIG. 9.

In the configuration of FIG. 9 in which the SRAM redundancy cells 19 are situated in portions of the word-decoder area, an efficient use of the chip area can be made as was in the previous examples. As a further variation of FIG. 9, cross sections where the sense-amplifier lines 121 and the word decoder 17 intersect may be used as areas for providing the SRAM redundancy cells 19.

The embodiments described above are only examples, and are not intended to limit the invention. In the present invention, the SRAM redundancy cells 19 may be provided in part of the area where a word decoder, a sub-word decoder, a column decoder, a sense amplifier line, or the like is situated, or may be provided at a cross section where the sense amplifier line and the word decoder intersect. Alternatively, as shown in FIG. 8, a portion of the word strap area (i.e., an area where back lining is made for word lines) may be used for providing the SRAM redundancy cells 19, or a cross section of the sense amplifier line and the word strap area may be used for providing the SRAM redundancy cells 19. In this manner, the present invention provides the SRAM redundancy cells 19 in an area around each block of a DRAM cell array by making efficient use of an area of an existing DRAM device element such as a decoder, a sense amplifier, etc.

Further, the present invention is not limited to these embodiments, but various variations and modifications may be made without departing from the scope of the present invention.

The present application is based on Japanese priority application No. 2001-102175 filed on Mar. 30, 2001, with the Japanese Patent Office, the entire contents of which are hereby incorporated by reference.

What is claimed is:

1. A semiconductor memory device, comprising:
   a data buffer for inputting/outputting data from/to an exterior of the device;
   a plurality of DRAM cell array blocks;
   an SRAM redundancy cell disposed at a peripheral portion of a corresponding one of said plurality of DRAM cell array blocks;
   a fuse circuit which stores an address of a defect memory cell in the DRAM cell array blocks;
   a comparison circuit which compares an input address with the address stored in said fuse circuit; and
   an I/O bus which couple said SRAM redundancy cell to said data buffer in response to an address match signal from said comparison circuit.

2. The semiconductor memory device as claimed in claim 1, further includes a sense amplifier line that is provided for each of said plurality of DRAM cell array blocks, wherein said SRAM redundancy cell is provided in part of an area generally allocated to said sense amplifier line.

3. The semiconductor memory device as claimed in claim 1, further includes a sub-word decoder that is provided for each of said plurality of DRAM cell array blocks, wherein said SRAM redundancy cell is provided in part of an area generally allocated to said sub-word decoder.

4. The semiconductor memory device as claimed in claim 1, further comprising a sense amplifier line and a sub-word decoder that are provided for each of said plurality of DRAM cell array blocks, wherein said SRAM redundancy cell is provided at a cross section where an extension of said sense amplifier line and an extension of said sub-word decoder intersect.

5. The semiconductor memory device as claimed in claim 1, further comprising a word strap area that is provided for each of said plurality of DRAM cell array blocks, wherein said SRAM redundancy cell is situated in part of an area generally allocated to said word strap area.

6. The semiconductor memory device as claimed in claim 1, further comprising a sense amplifier line and a word strap area that are provided for each of said plurality of DRAM cell array blocks, wherein said SRAM redundancy cell is situated at a cross section where an extension of said sense amplifier line and an extension of said word strap area intersect.

7. The semiconductor memory device as claimed in claim 1, further comprising a column decoder that is provided for each of said plurality of DRAM cell array blocks, wherein said SRAM redundancy cell is situated in part of an area generally allocated to said column decoder.

8. The semiconductor memory device as claimed in claim 1, further comprising a word decoder that is provided for each of said plurality of DRAM cell array blocks, wherein said SRAM redundancy cell is situated in part of an area generally allocated to said word decoder.

9. The semiconductor memory device as claimed in claim 1, wherein said SRAM redundancy cell which is situated around each of said plurality of DRAM cell array blocks has a memory capacity for replacing a single defect location in the DRAM cell array blocks.

10. The semiconductor memory device as claimed in claim 9, wherein said SRAM redundancy cell is capable of replacing a defect memory cell located in any one of said plurality of DRAM cell array blocks.

11. The semiconductor memory device as claimed in claim 10, wherein said fuse circuit is set such that when two or more defect locations are present in one of the DRAM cell array blocks, at least one of the defect locations is replaced by said SRAM redundancy cell of another one of the DRAM cell array blocks.

12. The semiconductor memory device as claimed in claim 1, wherein said comparison circuit compares a row address, a block address, and a column address of said input address with the address stored in said fuse circuit.

13. The semiconductor memory device as claimed in claim 12, further comprising:
   a word decoder which selectively activates a word line corresponding to the row address of said input address regardless of the comparison made by said comparison circuit;
   a column decoder which selectively activates a column line corresponding to the column address of said input address in response to an unmatched result found by said comparison circuit, and selectively activates a redundant column line corresponding to said SRAM redundancy cell in response to the address match found by said comparison circuit.

14. The semiconductor memory device as claimed in claim 13, wherein a number of bits of SRAM redundancy cells selected by said redundant column line is equal to a number of bits of data selected by said column line.

15. The semiconductor memory device as claimed in claim 1, further comprising:
   a sense amplifier line that is provided for each of said plurality of DRAM cell array blocks; and
   a word decoder that is provided for each of said plurality of DRAM cell array blocks,
wherein said SRAM redundancy cell is situated at a cross section where an extension of said sense amplifier line and an extension of said word decoder intersect.

* * * * *